United States Patent
Flock et al.

(10) Patent No.: US 11,280,454 B2
(45) Date of Patent: Mar. 22, 2022

(54) OPTOELECTRONIC SEMICONDUCTOR DEVICE AND FLASHLIGHT

(71) Applicant: OSRAM OLED GmbH, Regensburg (DE)

(72) Inventors: Klaus Flock, Regensburg (DE); Michael Schumann, Neu-Ulm (DE); Moritz Laubscher, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/260,942

(22) PCT Filed: Aug. 7, 2019

(86) PCT No.: PCT/EP2019/071246
§ 371 (c)(1),
(2) Date: Jan. 15, 2021

(87) PCT Pub. No.: WO2020/035373
PCT Pub. Date: Feb. 20, 2020

(65) Prior Publication Data
US 2021/0285606 A1    Sep. 16, 2021

(30) Foreign Application Priority Data

Aug. 17, 2018  (DE) .......................... 102018120073.0

(51) Int. Cl.
*F21L 4/00* (2006.01)
*H01L 25/075* (2006.01)
(Continued)

(52) U.S. Cl.
CPC .......... *F21L 4/005* (2013.01); *C09K 11/7774* (2013.01); *C09K 11/77347* (2021.01);
(Continued)

(58) Field of Classification Search
CPC ............... F21L 4/005; C09K 11/77347; C09K 11/77348; C09K 11/7774; F21V 23/003;
(Continued)

(56) References Cited

U.S. PATENT DOCUMENTS 10,907,776 B1 *  2/2021  Haddad .................... F21L 4/027
11,132,932 B2 *  9/2021  Behringer ............ G09G 3/2003
(Continued)

FOREIGN PATENT DOCUMENTS

WO    2008131743 A1    11/2008
WO    2019014145 A1    1/2019

OTHER PUBLICATIONS

"Datasheet OS-Core UX:3; ODV4040UX3.A3", Draft Version a.2; Sep. 15, 2017 (7 pages).
(Continued)

*Primary Examiner* — Tracie Y Green
(74) *Attorney, Agent, or Firm* — Arent Fox LLP (57) ABSTRACT

In one embodiment, the optoelectronic semiconductor device comprises a carrier having electrical connection surfaces on a carrier upper side. At least four semiconductor chips are configured to emit light of different colors from each other. The semiconductor chips are mounted close to each other on the connection surfaces so that a distance between adjacent semiconductor chips is at most 100 μm in a top view on the carrier upper side.

17 Claims, 7 Drawing Sheets (51) Int. Cl.
  *H01L 33/38*   (2010.01)
  *H01L 33/44*   (2010.01)
  *H01L 33/50*   (2010.01)
  *F21V 23/00*   (2015.01)
  *C09K 11/77*   (2006.01)
  *F21Y 113/13*  (2016.01)
  *F21Y 115/10*  (2016.01)

(52) U.S. Cl.
  CPC ...... *C09K 11/77348* (2021.01); *F21V 23/003* (2013.01); *H01L 25/0753* (2013.01); *H01L 33/382* (2013.01); *H01L 33/44* (2013.01); *H01L 33/502* (2013.01); *F21Y 2113/13* (2016.08); *F21Y 2115/10* (2016.08)

(58) Field of Classification Search
  CPC ... H01L 25/0753; H01L 33/382; H01L 33/44; H01L 33/502; H01L 25/167; H01L 33/505; H01L 33/504; H01L 33/508; H01L 33/58; H01L 33/62; H01L 33/50; F21Y 2113/13; F21Y 2115/10; G03B 2215/0567; G03B 15/05; G02B 19/0066
  See application file for complete search history.

(56) References Cited

U.S. PATENT DOCUMENTS

| | | | |
|---|---|---|---|
| 11,133,446 B2* | 9/2021 | Brick | H01L 33/44 |
| 2004/0218387 A1 | 11/2004 | Gerlach | |
| 2011/0049555 A1 | 3/2011 | Engl et al. | |
| 2013/0141013 A1 | 6/2013 | Kodama et al. | |
| 2016/0040854 A1 | 2/2016 | Zhang | |
| 2016/0381749 A1 | 12/2016 | Catalano | |
| 2017/0294418 A1 | 10/2017 | Edmond et al. | |
| 2018/0132329 A1 | 5/2018 | Yan et al. | |
| 2020/0080715 A1* | 3/2020 | Antretter | G09G 3/3233 |

OTHER PUBLICATIONS

"ODB VFLSE 1.14", www.osram-os.com; Version 1.0, Mar. 15, 2018 (16 pages).

International Search Report and Written Opinion for International Patent Application No. PCT/EP2019/071246, dated Dec. 18, 2019 (8 pages).

* cited by examiner

OPTOELECTRONIC SEMICONDUCTOR DEVICE AND FLASHLIGHT

This application is a 35 U.S.C. § 371 National Phase of PCT Application No. PCT/EP2019/071246, filed Aug. 7, 2019, which claims priority to German Patent Application No. 102018120073.0, filed Aug. 17, 2018, the disclosures of each of which are hereby incorporated by reference herein in their entireties.

An optoelectronic semiconductor device is specified. In addition, a flash light is specified.

An object to be solved is to specify an optoelectronic semiconductor device with which light of a certain spectral composition can be emitted efficiently and adjustably.

This object is solved inter alia by a semiconductor device having the features of claim 1. Preferred further developments are the subject of the remaining claims.

The semiconductor device described herein comprises, in particular, six semiconductor chips emitting in five different colors. The semiconductor chips are preferably located close to each other, so that no separate optical component is required for mixing the light of the semiconductor chips. Such a semiconductor device may be used in a flash light, wherein a color composition of the flash light is adaptable to ambient lighting conditions.

According to at least one embodiment, the semiconductor device comprises a carrier. In particular, the carrier is a circuit board such as a printed circuit board or such as a metal core board. Likewise, the carrier may be a ceramic substrate or a semiconductor substrate.

According to at least one embodiment, the carrier comprises electrical connection surfaces, preferably on a carrier upper side. The electrical connection surfaces are configured, for example, for solder assembly or for electrically conductive adhesive bonding. Furthermore, it is possible that a part of the connection surfaces is designed for a wire bond connection.

According to at least one embodiment, the semiconductor device comprises a plurality of semiconductor chips, preferably at least four different types of semiconductor chips or at least five different types of semiconductor chips, which are configured to emit light of different colors from each other. Thus, preferably at least four or at least five different colors are emitted by the semiconductor chips, preferably exactly five different colors. It is possible that there is only one semiconductor chip per color.

Alternatively, several semiconductor chips may be provided for one color or for several colors. Semiconductor chips for emitting the same color may be combined in a group.

According to at least one embodiment, the semiconductor chips are attached to the connection surfaces, for example by means of soldering or electrically conductive adhesive bonding. In this case, the semiconductor chips are located close to each other as seen in top view on the carrier upper side. Close together means in particular that a distance between adjacent semiconductor chips is at most 200 μm or 100 μm or 80 μm or 50 μm. Alternatively or additionally, the distance between adjacent semiconductor chips is at most 20% or 15% or 10% or 5% of an average edge length of the semiconductor chips as viewed in top view on the carrier upper side.

In at least one embodiment, the optoelectronic semiconductor device comprises a carrier having electrical connection surfaces on a carrier upper side. At least four semiconductor chips are configured to emit light of different colors from each other. The semiconductor chips are mounted close to each other on the connection surfaces so that a distance between adjacent semiconductor chips is at most 100 μm as seen in top view on the carrier upper side.

Flash light applications benefit from replicating ambient lighting as closely as possible. With the semiconductor device described here, it is possible to match a flash light, in particular, to ambient lighting conditions so that a relatively error-free reproduction of all colors occurring in a scene is ensured. Furthermore, it is possible to realize a flash light with the semiconductor device, in which a color modulation of a scene is possible.

In the semiconductor device described here, it is possible in particular to make use of conventional semiconductor chips and phosphors in order to efficiently achieve the desired color locus matching of the flash light and the semiconductor device. Preferably, phosphors for the colors red, green, yellow-orange and optionally cyan are used to obtain these colors preferably from blue light.

The carrier is preferably a circuit board on which six semiconductor chips can be placed. The distance between the individual semiconductor chips is in particular 100 μm or less. The semiconductor chips are thus relatively densely packed. The semiconductor chips are preferably unhoused semiconductor chips such as LED chips. Housed semiconductor chips usually comprise a white encapsulant, which is for example made of a silicone to which titanium dioxide particles are added. In order to exhibit sufficient reflectivity, such an encapsulant must comprise a wall thickness of typically at least 200 μm due to the comparatively large penetration depth of visible light.

With such semiconductor chips, it is thus possible to realize minimum distances in the range of 400 μm, plus a gap between the components, in order to be able to mount them. Thus, conventionally, a total distance between the semiconductor chips is at least 0.5 mm, which corresponds to about 50% of an edge length of the semiconductor chips. With such a comparatively large distance, additional optics are necessary to achieve sufficient light mixing. Furthermore, such arranging of semiconductor chips in mobile devices such as smartphones or tablets can only be used to a limited extent due to the critical space requirements.

Since the semiconductor chips described here preferably comprise a Lambertian radiation characteristic and are arranged close together, no separate mixing optics are required. Furthermore, a compact design can be realized.

With the carrier described here, for example, sequential control of all semiconductor chips is possible, in particular for so-called additive illumination. Furthermore, all semiconductor chips can be operated at the same time, with the exception of the semiconductor chips for a specific color, in order to obtain subtractive illumination. Furthermore, it is possible to operate a certain arbitrary selection and number of semiconductor chips at the same time. Further, all semiconductor chips can be driven at the same time.

In particular, semiconductor chips can be mounted on the carrier, which comprise electrical vias through an active zone and whose main radiation side can thus be free of electrical contact surfaces. ESD protection diodes can be used to protect against damage caused by electrostatic discharges. Temperature sensors such as NTCs can be used to measure the temperatures of the carrier at one or various points. It is possible to operate all semiconductor chips with a common cathode or anode or to provide the semiconductor chips with individually controllable cathodes and anodes. Combined semiconductor chips with and without phosphor can be placed, contacted as well as operated.

According to at least one embodiment, at least one of the semiconductor chips is configured to generate blue light. Preferably, there is exactly one semiconductor chip for generating blue light. The blue light is preferably generated directly in a semiconductor layer sequence and emitted directly. That is, preferably no phosphor is used for the blue light. A chromaticity coordinate of the generated blue light is preferably at the CIE x coordinates and CIE y coordinates of 0.159; 0.024 in the CIE standard chromaticity diagram, preferably with a tolerance of at most 0.005 units or 0.003 units or 0.001 units, respectively.

According to at least one embodiment, at least one of the semiconductor chips is configured to generate cyan-colored light. Preferably, exactly one such semiconductor chip is provided. The cyan-colored light can be generated directly from a semiconductor layer sequence or also with the aid of a phosphor. The color locus of the cyan-colored light in the CIE standard chromaticity diagram is in particular at the coordinates 0.079; 0.453, for example with a tolerance of at most 0.005 units or 0.003 units or 0.001 units.

According to at least one embodiment, at least one of the semiconductor chips is configured to generate green light. In particular, exactly one semiconductor chip is provided for generating green light. The color locus of the green light is preferably located at coordinates 0.286; 0.574 in the CIE standard chromaticity diagram, preferably with a tolerance of at most 0.005 units or 0.003 units or 0.001 units.

According to at least one embodiment, at least one of the semiconductor chips is configured to generate yellow-orange light. In particular, exactly one semiconductor chip is provided for generating yellow-orange light. The yellow-orange light preferably comprises the coordinates 0.543; 0.429 in the CIE standard chromaticity diagram, in particular with a tolerance of at most 0.005 units or 0.003 units or 0.001 units.

According to at least one embodiment, the semiconductor device comprises at least one semiconductor chip for generating red light. Preferably, exactly one or exactly two semiconductor chips for red light are provided. A color locus of the red light in the CIE standard chromaticity diagram is in particular at the coordinates 0.680; 0.316, for example with a tolerance of at most 0.005 units or 0.003 units or 0.001 units.

According to at least one embodiment, the green, yellow-orange and red light are each generated by at least one phosphor. In this process, a primary radiation such as blue light is preferably completely or almost completely converted into the light of the desired color. That is, the green, yellow-orange and red light is preferably generated from blue light via full conversion. The primary light sources for the semiconductor chips for green, yellow-orange and red light can be identical in construction to the semiconductor chip for blue light. The cyan-colored light can either be generated via full conversion from blue light by means of at least one phosphor or emitted directly from a semiconductor layer sequence.

The semiconductor layer sequence of the semiconductor chips for generating the blue and/or cyan-colored light is based in particular on the material system AlInGaN.

The phosphors are in particular selected from the following group: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets of the general system $(Gd,Lu,Tb,Y)_3(Al,Ga,D)_5(O,X)_{12}:RE$ where X=halide, N or divalent element, D=trivalent or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$ with RE=rare earth metals; nitrido-orthosilicates like $AE_{2-x-a}RE_xEu_aSiO_{4-x}N_x$ or $AE_{2-x-a}RE_x Eu_aSi_{1-y}O_{4-x-2y}N_x$ where RE=rare earth metal and AE=alkaline earth metal or such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM phosphors from the $BaO-MgO-Al_2O_3$ system such as $BaMgAl_{10}O_{17}:Eu^{2+}$; halophosphates such as $M_5(PO_4)_3(Cl,F):(Eu^{2+},Sb^{2+},Mn^{2+})$; SCAP phosphors such as $(Sr,Ba,Ca)_5(PO_4)_3Cl:Eu^{2+}$; KSF phosphors based in particular on potassium, silicon and fluorine such as $K_2SiF_6:Mn^{4+}$. In addition, so-called quantum dots can also be introduced as converter material. Quantum dots in the form of nanocrystalline materials containing a group II-VI compound and/or a group III-V compound and/or a group IV-VI compound and/or metal nanocrystals are preferred. Furthermore, the phosphor may have a quantum well structure and be epitaxially grown.

Preferred phosphors used are:
optionally for cyan-colored light $(Sr,Ba)Si_2O_2N_2:Eu$,
for green light NOS:Eu, LuYAG:Ce or YAG:Ce,
for yellow-orange light $(Sr,Ca)AlSiN:Eu$ mixed with YAG:Ce, and/or
for red light $(Sr,Ca)AlSiN:Eu$, in particular CaAlSiN:Eu.

Optionally, a semiconductor chip is provided to generate white light. The white light is then composed of, for example, blue primary radiation and yellow light from the phosphor, which is, for example, YAG:Ce.

According to at least one embodiment, the blue light comprises an intensity maximum between 445 nm and 455 nm inclusive, in particular at 450 nm. The same values may apply to a dominant wavelength of the blue light. Alternatively or additionally, a half width of the spectrum of the blue light is at least 15 nm and/or at most 40 nm.

According to at least one embodiment, the emission spectrum of the cyan-colored light comprises an intensity maximum between 500 nm and 512 nm, inclusive. The same values may apply to a dominant wavelength of the cyan-colored light. A half width of the emission spectrum of the cyan-colored light is alternatively or additionally at least 15 nm and/or at most 40 nm.

According to at least one embodiment, the emission spectrum of the green light comprises an intensity maximum between 520 nm and 535 nm inclusive, in particular between 528 nm and 532 nm inclusive. The same values may apply to a dominant wavelength. Alternatively or additionally, a half width of the emission spectrum of the green light is at least 35 nm and/or at most 90 nm.

According to at least one embodiment, the emission spectrum of the yellow-orange light comprises an intensity maximum between 595 nm and 615 nm inclusive, in particular between 600 nm and 605 nm inclusive. The same may apply to a dominant wavelength of the emission spectrum of the yellow-orange light. A half width of this emission spectrum is preferably at least 50 nm and/or at most 100 nm.

According to at least one embodiment, the emission spectrum of the red light comprises an intensity maximum between 625 nm and 650 nm inclusive, in particular between 635 nm and 642 nm inclusive. The same may apply to a dominant wavelength. A half width of the emission spectrum of the red light is preferably at least 50 nm and/or at most 100 nm.

The intensity maxima are preferably absolute maxima. The emission spectra may each be free of secondary maxima.

Due to the comparatively broad emission spectra for the green, yellow-orange and red light, high color rendering indices can be achieved. If lower color rendering indices are sufficient, the red, yellow-orange and/or green light can be generated directly via semiconductor chips and their semiconductor layer sequence without the aid of phosphors. However, when the desired light is generated directly from a semiconductor layer sequence, the associated emission spectrum comprises only a comparatively small spectral width.

According to at least one embodiment, the semiconductor chips are arranged in one, in two or in more rows on the carrier upper side. Each of the rows preferably comprises the same number of semiconductor chips, in particular an odd number of semiconductor chips in each case.

According to at least one embodiment, the semiconductor chips are arranged as point-symmetrically as possible with respect to their emission properties, as seen in top view on the carrier upper side. For example, the red emitting semiconductor chips are located at opposite corners of the arrangement of semiconductor chips. The same is preferably true for the cyan emitting semiconductor chips and the blue emitting semiconductor chips taken together. The green and yellow-orange emitting semiconductor chips may be centrally arranged in the rows, wherein one of the rows may comprise the green emitting semiconductor chip and another one of the rows may comprise the orange-yellow emitting semiconductor chip.

According to at least one embodiment, the semiconductor chips or groups of semiconductor chips for a particular color are electrically controllable individually and independently of one another. Thus, in particular, the intensities of the light of the different colors can be freely adjusted relative to each other. The semiconductor chips can be operated either simultaneously, partially simultaneously, partially sequentially or completely sequentially. Sequentially means one after the other in time, wherein there can be no temporal overlap during operation or there can be a small temporal overlap. In particular, it is possible to control the light intensity of the semiconductor chips via pulse width modulation or via the maximum operating current.

According to at least one embodiment, the semiconductor chips exhibit a Lambertian or an approximately Lambertian radiation characteristic. Lambertian radiation characteristic means that for an intensity I as a function of a radiation angle A the following applies: $I(A)=I_0 \cos(A)$. Approximate Lambertian radiation pattern means in particular that the aforementioned relationship applies with a tolerance of at most $0.05\ I_0$ or of at most $0.02\ I_0$.

According to at least one embodiment, the semiconductor chips on the carrier have a common anode terminal or a common cathode terminal. This allows a number of external electrical contact pads on the carrier for external electrical connection to be reduced.

According to at least one embodiment, the semiconductor chips or the groups of semiconductor chips of a particular color each have their own anode terminal and their own cathode terminal. This allows a particularly fast tuning of the intensities of the semiconductor chips relative to each other.

According to at least one embodiment, the semiconductor chips are attached to the carrier separated from each other by a gas-filled or evacuated gap. That is, there are no external optical shields between the semiconductor chips, such as encapsulants made of a plastic and having admixed particles of, for example, a reflective metal oxide or an absorbent material such as carbon black.

It is possible that a thin-walled optical shield is provided directly on the semiconductor chips, for example made of a metal. Such a shield typically comprises a thickness of at most 100 μm or 75 μm or 5 μm or 1 μm or 0.3 μm and thus does not significantly contribute to a distance between light emitting regions of the semiconductor chips.

A singulation between the semiconductor chips in the course of their manufacture is carried out, for example, by means of sawing. Alternatively, separation can be performed with a laser. In the case of sawing, a wall thickness or thickness of the shield is, for example, around 75 μm, while in the case of laser separation it is significantly less. It should also be noted that in the case of semiconductor chips with phosphors, which can be applied in particular by spraying or by means of layer transfer, a certain amount of scattering within the conversion layer naturally leads to a reduction in the effective wall thickness.

According to at least one embodiment, a protection diode against damage from electrostatic discharges is associated with each of the semiconductor chips or each group of semiconductor chips of a particular color. Such a protection diode is also referred to as an ESD diode, wherein ESD stands for ElectroStatic Discharge.

According to at least one embodiment, the protective diodes are each mounted close to the chip. Close to the chip means in particular that a distance between the semiconductor chip concerned and the associated protective diode is at most the mean edge length or at most twice the mean edge length or at most three times the mean edge length of the semiconductor chip concerned, as seen in top view on the carrier upper side.

According to at least one embodiment, semiconductor layer sequences of at least part of the semiconductor chips or of all semiconductor chips each comprise one or more vias through an active zone. Preferably, many such vias are present via each semiconductor chip. In particular, the vias extend from a p-type side through the active zone into an n-type side of the semiconductor layer sequence. The vias may terminate within the n-type side, so that a radiation exit side of the semiconductor layer sequences may be formed continuously by semiconductor material in each case.

Furthermore, a flash light is specified. The flash light comprises at least one semiconductor device as described in connection with one or more of the above embodiments. Features of the flash light are therefore also disclosed for the semiconductor device, and vice versa.

In at least one embodiment, the flash light comprises a semiconductor device and a control unit. The control unit is configured to energize the semiconductor chips in a pulsed manner. For example, a pulse duration or a duration of a pulse train of the energization of the semiconductor chips is at least 20 μs or 1 ms or 10 ms and/or at most 0.5 seconds or 200 ms or 80 ms.

According to at least one embodiment, the control unit is configured to operate each of the semiconductor chips at a maximum current of at least 0.2 A or 0.5 A or 1.2 A. Alternatively or additionally, the intended maximum current is at most 3 A or 2 A. Since the semiconductor devices are preferably operated as flash light only for a short time, high currents can be provided for a short time for the semiconductor chips to generate light of a high intensity. This in particular applies if the semiconductor chips are operated sequentially.

According to at least one embodiment, only one imaging optics is arranged downstream of the semiconductor chips as optical element, preferably exactly one imaging optics. The imaging optics is preferably common to all semiconductor chips. The imaging optics is in particular a lens, such as a converging lens or a Fresnel lens. Thus, the flash light can be free of a light mixing device for the light of mutually different colors of the semiconductor chips. Preferably, no diffuser plate or scattering plate is arranged over the semiconductor chips. Optionally, however, a diffuser plate may be used, or a light-in-the-box arrangement may be used, in which in particular a diffusely reflecting box is arranged around the semiconductor chips.

The imaging optics is preferably an optical imaging element. Such optical elements preferably comprise a low overall height. This makes it possible to realize flat smartphones or tablets. For example, an overall height of the imaging optics is at most 3 mm or 2 mm or 1.5 mm or 1 mm. For example, a distance between the semiconductor chips and the imaging optics is at least 0.2 mm or 0.5 mm and/or at most 2 mm or 1 mm.

In the following, an optoelectronic semiconductor device described herein and a flash light described herein will be explained in more detail with reference to the drawing by means of exemplary embodiments. Identical reference signs indicate identical elements in the individual figures. However, no references to scale are shown, rather individual elements may be shown exaggeratedly large for better understanding.

Figure 1:
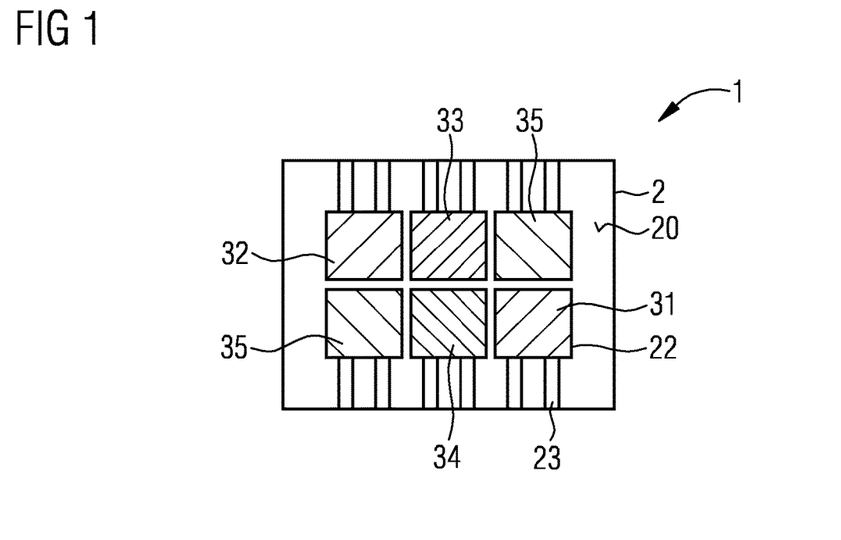
FIGS. 1 to 3 show schematic top views of exemplary embodiments of optoelectronic semiconductor devices described herein.

FIG. 1 shows an exemplary embodiment of an optoelectronic semiconductor device 1. The semiconductor device 1 comprises a carrier 2 having a carrier upper side 20. The carrier 2 is, for example, a circuit board in the form of a printed circuit board. The carrier upper side 20 may be planar in shape. Viewed from above, the carrier upper side 20 comprises, for example, a square, rectangular or even a polygonal such as hexagonal base area.

A plurality of electrical connection surfaces 22 are provided on the carrier upper side 20. A plurality of semiconductor chips 31, 32, 33, 34, 35 are provided on the carrier upper side 20 substantially in congruence with the connection surfaces 22. Electrical contact pads of the semiconductor chips 31, 32, 33, 34, 35 preferably face the carrier 2. Thus, main radiation sides of the semiconductor chips 31, 32, 33, 34, 35 facing away from the carrier 2 can be free of electrical connection pads.

Optionally, electrical conductor tracks 23 lead away from the connection pads 22 and thus from the semiconductor chips 31, 32, 33, 34, 35. Deviating from the illustration in FIG. 1, it is possible that electrical vias are located under the connection surfaces 22 and thus under the semiconductor chips 31, 32, 33, 34, 35, so that the semiconductor chips can be electrically contacted from an underside of the carrier 2 which is not drawn. In this case, the carrier 2 may be designed as a so-called submount or intermediate carrier.

The semiconductor device 1 comprises five semiconductor chips 31, 32, 33, 34, 35 or groups of semiconductor chips emitting in different colors. For example, a semiconductor chip 31 is provided in which blue light is generated directly from a semiconductor layer sequence. From another semiconductor chip 32, cyan-colored light is preferably generated directly out of a semiconductor layer sequence or also out of a phosphor.

For example, in the middle of the two rows of semiconductor chips 31, 32, 33, 34, 35, there is a semiconductor chip 33 for generating green light and a semiconductor chip 34 for generating yellow-orange light. In opposite corners, there are two semiconductor chips 35 for generating red light. These two semiconductor chips 35 may be grouped together as a red light group.

The semiconductor chips 31, 32, 33, 34, 35 are arranged close to each other. That is, a distance between adjacent semiconductor chips 31, 32, 33, 34, 35 is significantly smaller than an average edge length of the semiconductor chips. When viewed in top view, all semiconductor chips 31, 32, 33, 34, 35 may have the same size or approximately the same size. For example, the semiconductor chips 31, 32, 33, 34, 35 each comprise an edge length of 1 mm. The distance between the semiconductor chips 31, 32, 33, 34, 35 is at most 0.1 mm each. A gap between the semiconductor chips 31, 32, 33, 34, 35 is formed, for example, by an air-filled gap.

Figure 2:
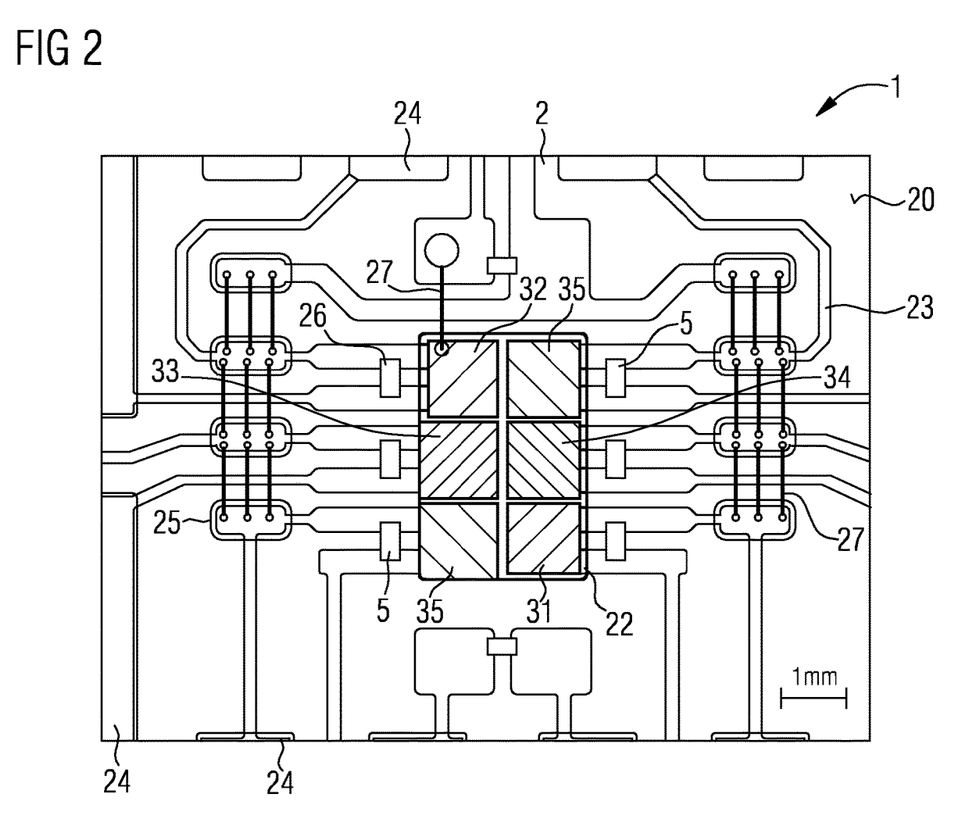

FIG. 2 illustrates another exemplary embodiment. The semiconductor chips 31, 32, 33, 34, 35 are similarly arranged relative to each other, as illustrated in connection with FIG. 1, and preferably comprise the same or similar spectral emission characteristics. Close to the chips 31, 32, 33, 34, 35, respectively, associated protection diodes 5 are provided against damage by electrostatic discharges. The protective diodes 5 connect the conductor tracks 23 for the respective electrical contacting of the semiconductor chips 31, 32, 33, 34, 35 to each other. A distance of the protective diodes 5 from the associated semiconductor chip 31, 32, 33, 34, 35 is approximately 50% of an edge length of the semiconductor chip concerned.

The semiconductor chips 31, 33, 34, 35 are thereby designed as illustrated in FIG. 1. That is, these semiconductor chips 31, 33, 34, 35 comprise electrical connection pads on a side facing the carrier upper side 20. In the case of the semiconductor chip 32, on the other hand, an electrical connection pad is located on a side facing away from the carrier 2, for example of a chip carrier or a semiconductor layer sequence. Electrical contact is made from this connection pad facing away from the carrier 2 via a bonding wire 27. The conductor tracks 23 towards the semiconductor chip 32 on the carrier upper side 20 can be designed in the same way as for the semiconductor chips 31, 33, 34, 35 and can thus be short-circuited by means of an electrical bridge 26.

The carrier 2 and its connection surfaces 22 as well as electrical leads 23 are preferably designed in such a way that the semiconductor chips 31, 32, 33, 34, 35 can each be electrically contacted either via a separate anode and a separate cathode or that the semiconductor chips 31, 32, 33, 34, 35 have a common cathode or a common anode.

This is made possible by the fact that the semiconductor chips 31, 32, 33, 34, 35 are each assigned two external electrical contact pads 24 of the carrier 2. For each semiconductor chip, one of the two associated contact pads 24 comprises an electrical contact track 23 which leads to an electrical intermediate island 25. In other words, in each case an electrical intermediate island 25 lies in the electrical conduction path between the semiconductor chips 31, 32, 33, 34, 35 concerned and the associated contact pad 24. The intermediate islands 25 can be connected to one another, for example, via the bonding wires 27, wherein preferably adjacent intermediate islands 25 are in each case connected to one another via a plurality of the bonding wires.

Thus, a common cathode or a common anode can be provided for all semiconductor chips if the bonding wires 27 are provided between the intermediate islands 25. If the bonding wires 27 between the intermediate islands 25 are omitted, each of the semiconductor chips 31, 32, 33, 34, 35 has two contact pads 24 for its own cathode as well as for its own anode.

Preferably, one or more temperature sensors 55 are further provided on the carriers 2. The at least one temperature sensor 55 is, for example, an NTC, i.e. a semiconductor resistor with a negative temperature coefficient. By means of at least one temperature sensor 55 it is possible to take into account temperature dependencies of phoshphors of the semiconductor chips 32, 33, 34, 35 or of a semiconductor layer sequence of the semiconductor chips 31, 32, 33, 34, 35 during radiation generation and thus to adjust a current supply of the semiconductor chips 31, 32, 33, 34, 35 accordingly as a function of temperature in order to generate light of the desired spectral properties.

Figure 3:
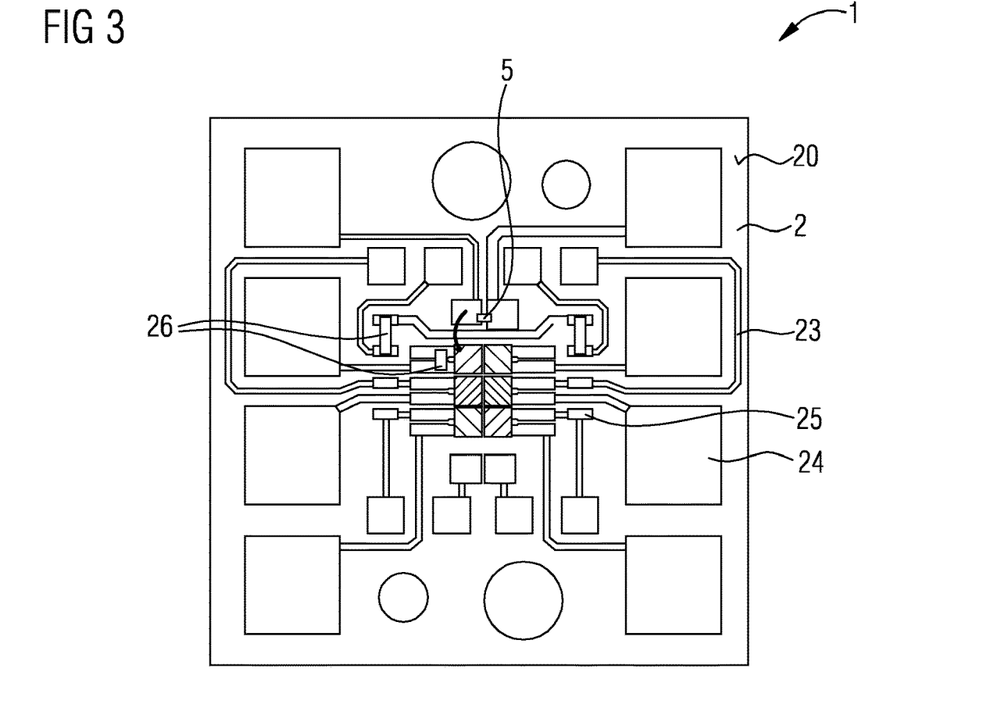

In FIG. 3 an arrangement of the contact pads 24 as well as the conductor tracks 23 is illustrated in more detail. There are no bonding wires between the intermediate islands 25, so that each of the semiconductor chips 31, 32, 33, 34, 35 has its own anode and its own cathode. In all other respects, the explanations on FIGS. 1 and 2 apply accordingly.

Figure 4:
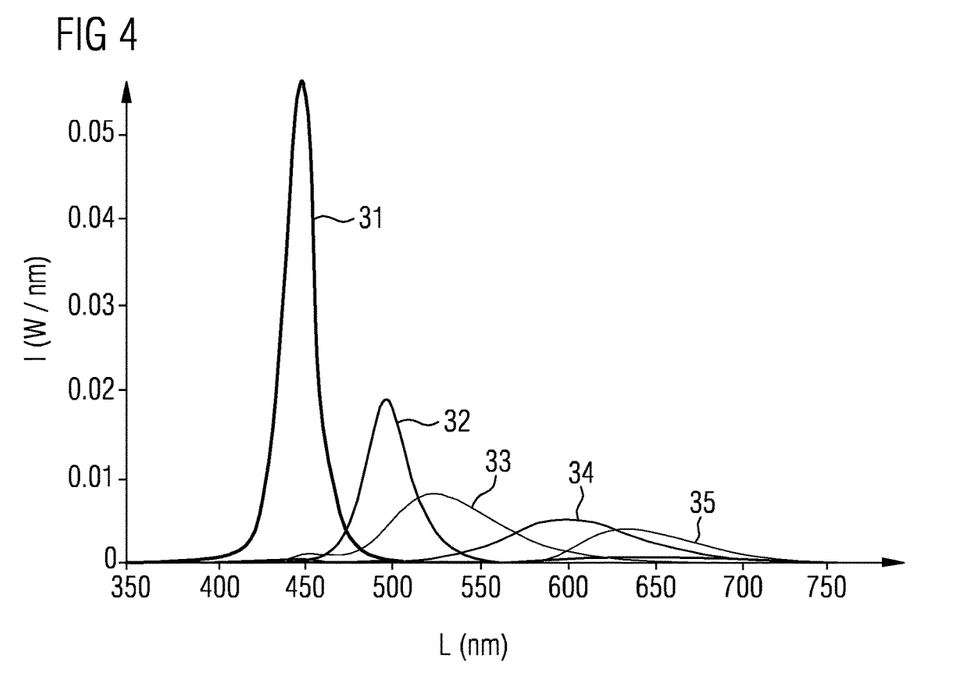
FIGS. 4 to 10 show schematic representations of spectral characteristics of exemplary embodiments of optoelectronic semiconductor devices described herein.

FIG. 4 illustrates an example of an intensity I in W/nm versus a wavelength L in nm of emission spectra of the semiconductor chips 31, 32, 33, 34, 35. FIG. 4 illustrates in particular the spectral radiant power per color of the semiconductor chips at an operating current of 1 A. It is possible that a spectral half width of the emission spectra increases continuously toward longer wavelengths. Furthermore, a maximum intensity of the emission spectra preferably increases continuously in the direction toward smaller wavelengths.

The blue light as emitted from the semiconductor chip 31 preferably has a maximum intensity wavelength around 450 nm. A spectral half width is about 20 nm.

The emission spectrum of the semiconductor chip 32 for cyan-colored light preferably originates directly from a semiconductor layer sequence. The intensity maximum of this spectrum is about 500 nm with a spectral half width around 30 nm.

The spectra of the semiconductor chips 33, 34, 35 are preferably each generated by means of full conversion by a phosphor. The intensity maximum of the spectrum of the semiconductor chip 33 for green light is about 527 nm with a spectral half width of about 80 nm. The intensity maximum of the yellow-orange light of the semiconductor chip 34 is about 605 nm with a spectral half width of about 90 nm. The spectrum for the red light of semiconductor chip 35 comprises an intensity maximum at about 640 nm with a spectral half width around 90 nm.

The phosphors for the semiconductor chips 33, 34, 35 are preferably operated in full conversion, so that the semiconductor chips 33, 34, 35 comprise as primary radiation in particular the spectrum of the semiconductor chip 31 and can thus comprise an LED chip identical in construction to the semiconductor chip 31. The spectra in the red and orange-yellow spectral range are preferably free of blue light. In the emission spectrum for the green-emitting semiconductor chip 33, a small residual amount of blue light may still be present, but this does not affect the spectral properties of the green light or does not affect them significantly.

Figure 5:
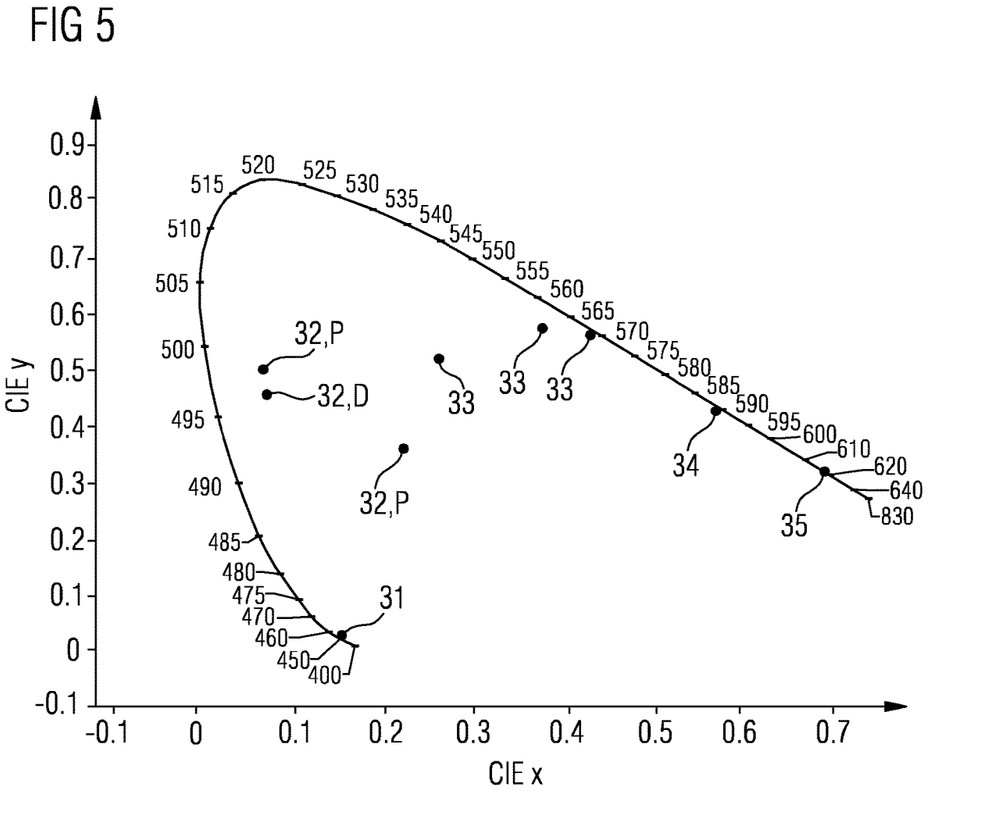
Figure 6:
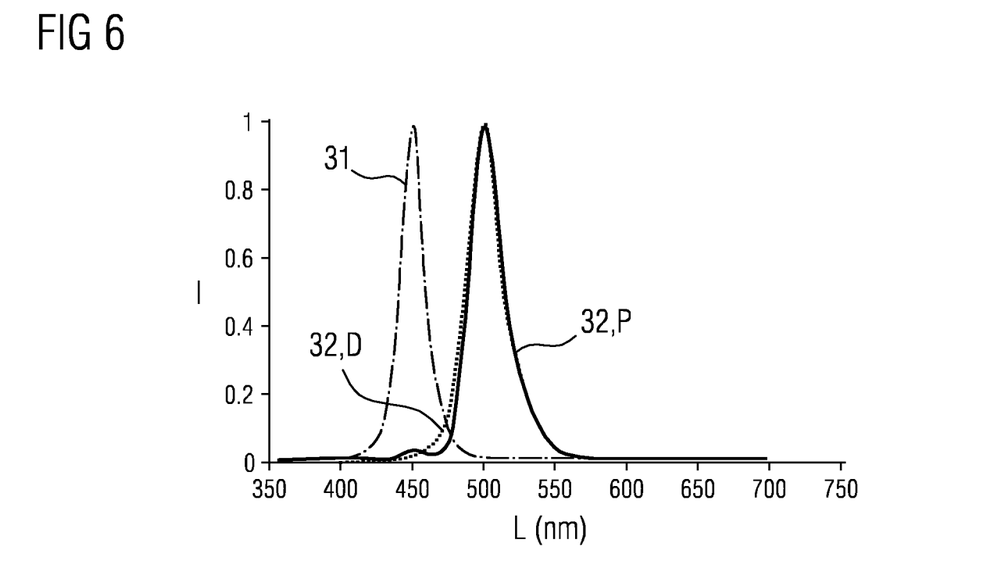
Figure 7:
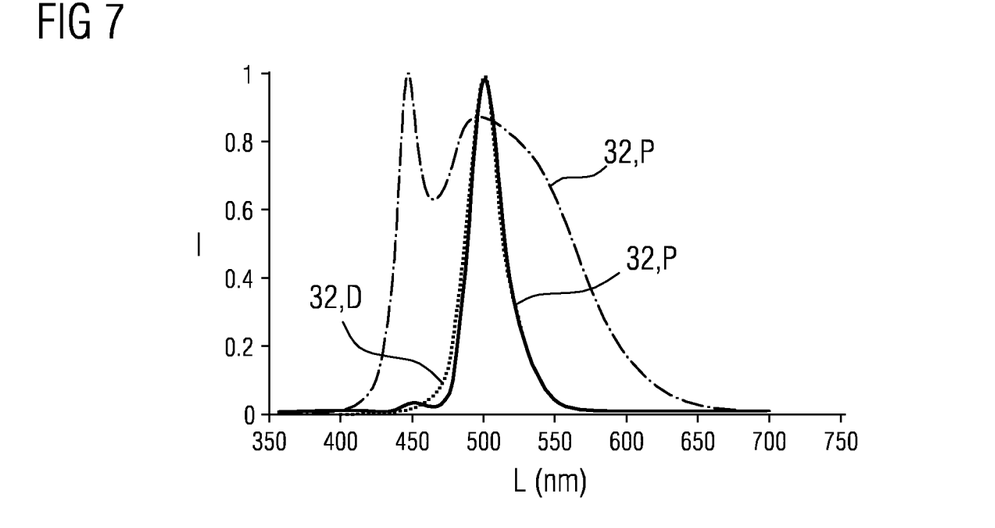
Figure 8:
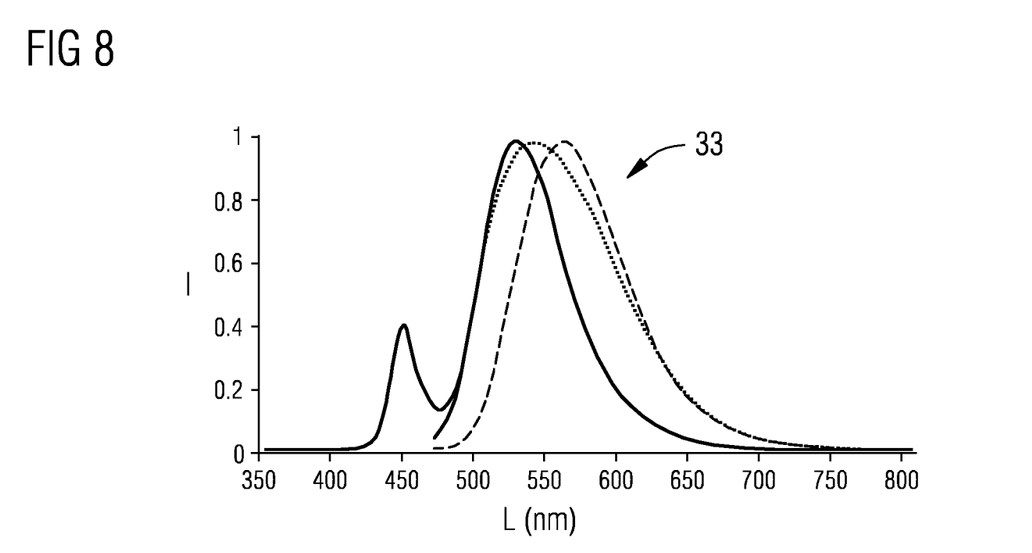
Figure 9:
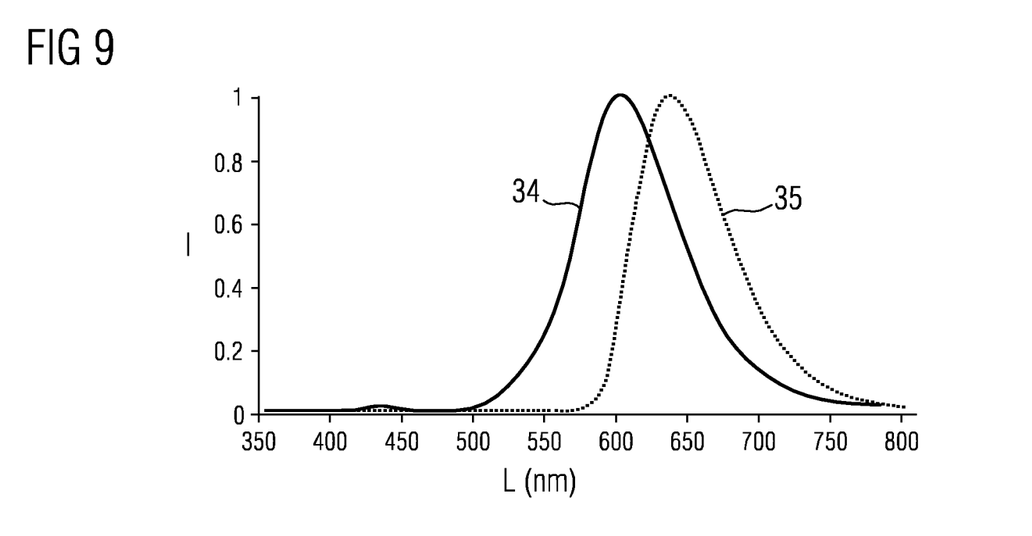

FIG. 5 shows the CIE standard chromaticity diagram of 1931 in xy-representation. Examples of color loci of the emission spectra of the semiconductor chips 31, 32, 33, 34, 35 are shown. Several examples are specified for green, as well as for cyan-colored light. For cyan-colored light, examples with phosphor, abbreviated as P, and an example without phosphor, abbreviated as D, are specified.

The plotted color loci preferably apply with a tolerance of at most 0.003 units in the standard chromaticity diagram, in particular with respect to the semiconductor chips 31, 34, 35. The color loci for the semiconductor chips 32, 33 for cyan-colored light and for green light may be provided with a larger tolerance, for example with a tolerance of at most 0.007 units or 0.005 units.

The corresponding emission spectra, scaled to unity, can be found in FIGS. 6 to 9.

Figure 10:
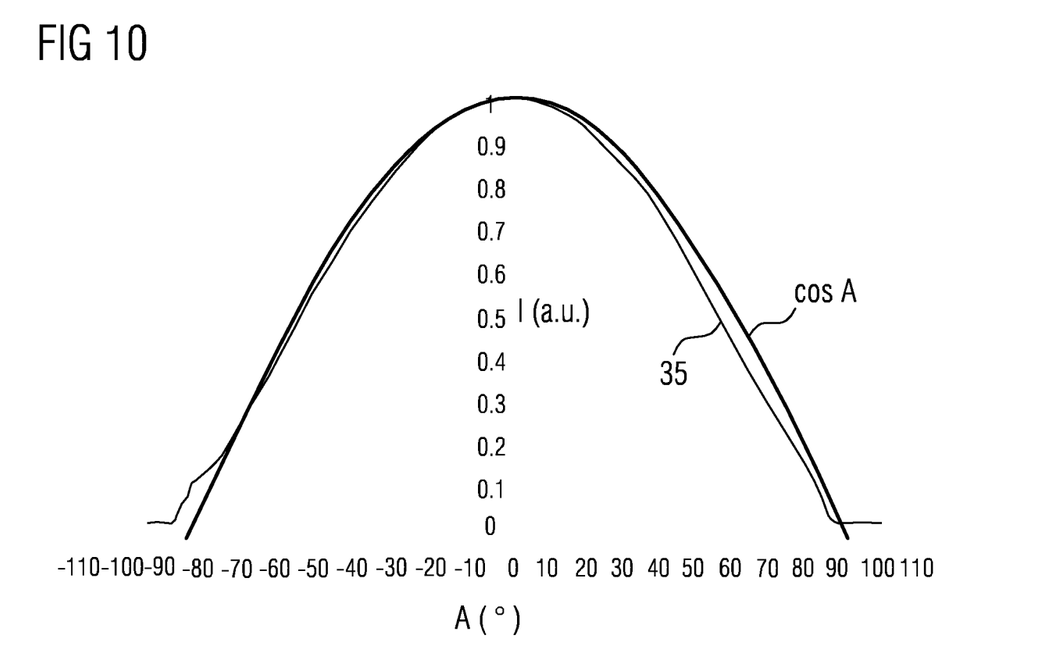

FIG. 10 shows an example of a dependence of the intensity I on a radiation angle A for the red-emitting semiconductor chip 35. This radiation characteristic is compared with a Lambertian (=cos(A)) angle dependence. From FIG. 10 it can be seen that the semiconductor chip 35 approximately comprises a Lambertian radiation characteristic. The same applies preferably to all other semiconductor chips 31, 32, 33, 34.

Figure 11:
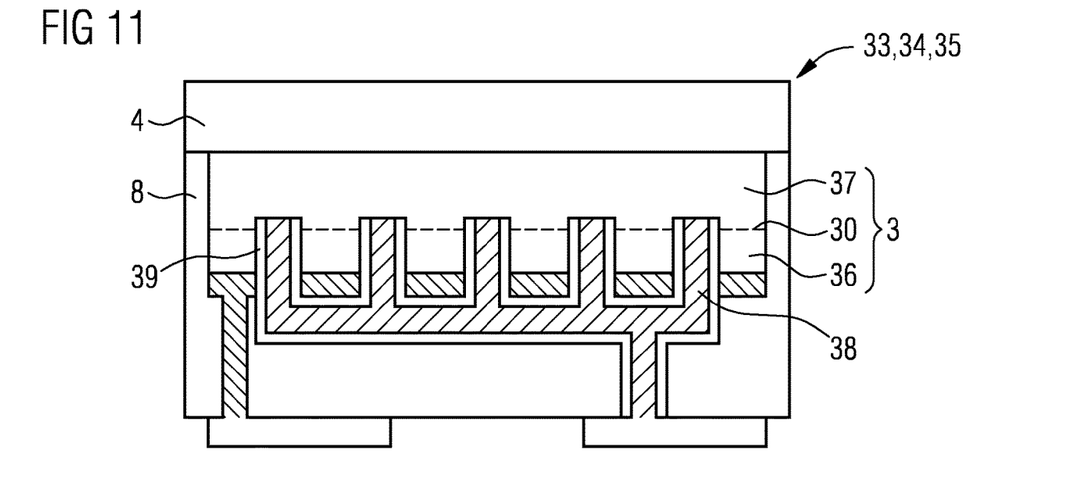
FIG. 11 shows a schematic sectional view of a semiconductor chip for exemplary embodiments of optoelectronic semiconductor devices described herein.

FIG. 11 shows an exemplary structure of the semiconductor chips 33, 34, 35. Via an active zone 30 in a semiconductor layer sequence 3, electrical vias 38 extend from a p-type first semiconductor region 36 into an n-type second semiconductor region 37. The vias 38 terminate in the second semiconductor region 37.

Between the vias 38 and a further electrically conductive contact layer, electrical short circuits are prevented by means of an electrical insulation 39. The respective electrical contacts are led to connection pads on an underside of the semiconductor chips 33, 34, 35. The second semiconductor region 37 may optionally be provided with a roughening for improving a light coupling-out efficiency.

A phosphor 4 is provided on the semiconductor layer sequence 3. A thickness of the phosphor 4 is, for example, between 100 µm and 200 µm inclusive, depending on the phosphor used. The phosphor 4 may be a ceramic phosphor or may be formed by phosphor particles embedded in a matrix material such as a silicone. Preferably, the phosphor 4 completely covers the semiconductor layer sequence 3 with a constant layer thickness.

It is possible that the semiconductor chip comprises an optical insulation 8. The optical insulation 8 is formed, for example, by a metal and/or by an opaque plastic. A thickness of the optional optical insulation 8 is preferably at most 5 µm. Instead of such an optical insulation 8, there may also be only a side surface passivation made of a transparent material such as silicon dioxide.

In the case of the semiconductor chips 31, 32 for generating blue light and cyan-colored light, preferably no phosphor is present. In other respects, the semiconductor chips 31, 32 may correspond to the semiconductor chips 33, 34, 35 illustrated in FIG. 7.

Deviating from the illustration of FIG. 11, it is possible that in each case one of the electrical connection pads of the semiconductor chips 31, 32, 33, 34 and/or 35 is located on the semiconductor layer sequence 3 or on a chip carrier, not drawn, adjacent to the semiconductor layer sequence 3 and thus need not be disposed at the underside.

For example, the semiconductor chips 31, 33, 34, 35 and optionally 32 are designed as described in the publication WO 2008/131743 A1, FIG. 1B. Optionally, the semiconductor chip 32 is designed as described in the publication US 2011/0049555 A1, FIG. 1.

Figure 12:
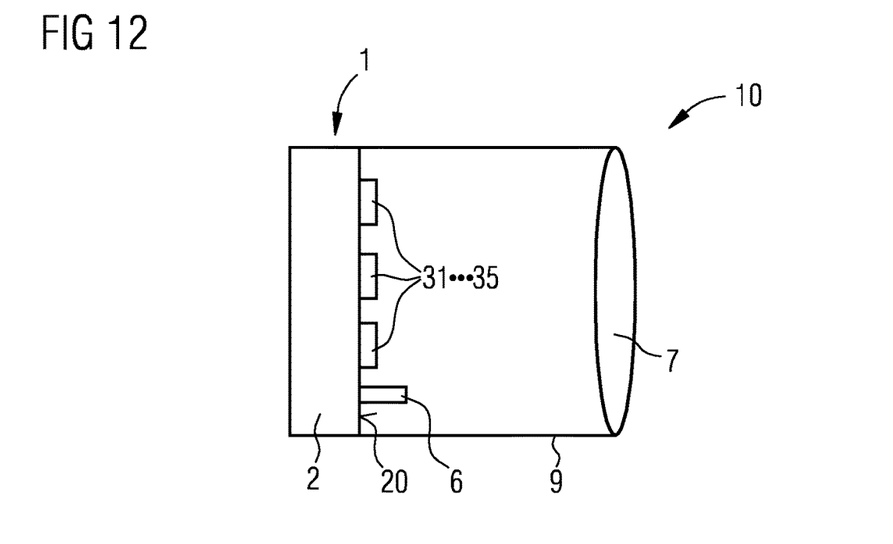
FIG. 12 shows a schematic sectional view of an exemplary embodiment of a flash light described herein.

In FIG. 12, a flash light 10 is shown. The flash light 10 comprises a semiconductor device 1 as explained in connection with FIGS. 1 to 7. Furthermore, a control unit 6 may be attached to the carrier 2 for pulsed operation of the semiconductor chips 31, 32, 33, 34, 35. The control unit 6 may also already be an integral part of the semiconductor device 1.

An imaging optics 7 is preferably arranged downstream of the semiconductor chips in common. The imaging optics 7 is integrated, for example, in a housing 9. The separate housing 9 is optional.

Due to the fact that the semiconductor chips 31, 32, 33, 34, 35 are arranged close to each other on the carrier 2, no further optics are necessary in addition to the imaging optics 7. In particular, no component is required within the package 9 for mixing the light from the various semiconductor chips 31, 32, 33, 34, 35.

Unless otherwise indicated, the components shown in the figures preferably follow each other directly in the sequence indicated. Layers not touching each other in the figures are preferably spaced apart. Insofar as lines are drawn parallel to each other, the corresponding surfaces are preferably also aligned parallel to each other. Also, unless otherwise indicated, the relative positions of the drawn components to each other are correctly reproduced in the figures.

This patent application claims priority to German patent application 10 2018 120 073.0, the disclosure content of which is hereby incorporated by reference.

The invention described herein is not limited by the description based on the exemplary embodiments. Rather, the invention encompasses any new feature as well as any combination of features, which in particular includes any combination of features in the patent claims, even if that feature or combination itself is not explicitly specified in the patent claims or exemplary embodiments.

LIST OF REFERENCE SIGNS 1 optoelectronic semiconductor device
2 carrier
20 carrier upper side
22 electrical connection surface
23 electrical conductor track
24 external electrical contact pad
25 electrical intermediate island
26 electrical bridge
27 bonding wire
3 semiconductor layer sequence
30 active zone
31 semiconductor chip for blue light
32 semiconductor chip for cyan-colored light
33 semiconductor chip for green light
34 semiconductor chip for yellow-orange light
35 semiconductor chip for red light
36 first semiconductor region
37 second semiconductor region
38 via
39 electrical insulation
4 phosphor
5 protection diode against damage by electrostatic discharge
55 temperature sensor
6 control unit
7 imaging optics
8 optical insulation
9 housing
10 flash light
A radiation angle
I intensity
L wavelength
x CIE-x coordinate in the standard chromaticity diagram
y CIE-y coordinate in the chromaticity diagram

The invention claimed is:

1. A flash light, comprising:
  a semiconductor device, comprising:
    a carrier having electrical connection surfaces on a carrier upper side;
    at least four semiconductor chips configured to emit light of mutually different colors; and
    wherein the semiconductor chips are mounted close to each other on the connection surfaces such that a distance between adjacent semiconductor chips is at most 100 µm in a top view on the carrier upper side; and
  a control unit,
  wherein control unit is configured to energize the semiconductor chips in a pulsed manner.

2. The flash light according to claim 1,
  wherein
    at least one of the semiconductor chips is configured to generate blue light,
    at least one of the semiconductor chips is configured to generate cyan-colored light,
    at least one of the semiconductor chips being configured to generate green light,
    at least one of the semiconductor chips is configured to generate yellow-orange light, and
    at least one of the semiconductor chips is configured to generate red light.

3. The flash light according to claim 1,
  wherein there are two semiconductor chips for red light and only one semiconductor chip for any other color, and
  wherein the semiconductor chips are arranged in two rows and, as seen in plan view of the carrier upper side, are as point-symmetrical as possible with respect to their emission properties.

4. The flash light according to claim 1, wherein
  exactly one of the semiconductor chips is configured to generate blue light,
  exactly one of the semiconductor chips is configured to generate cyan-colored light,
  exactly one of the semiconductor chips is configured to generate green light,
  exactly one of the semiconductor chips is configured to generate yellow-orange light,
  exactly two of the semiconductor chips are configured to generate red light, and
  the semiconductor chips are arranged in two rows and, as seen in top view on the carrier upper side, as point-symmetrically as possible with respect to their emission properties.

5. The flash light according to claim 1, wherein only one imaging optics is arranged downstream of the semiconductor chips as an optical element, so that the flash light is free of a light mixing device for the light of mutually different colors from the semiconductor chips.

6. An optoelectronic semiconductor device comprising
  a carrier having electrical connection surfaces on a carrier upper side, and
  having a plurality of semiconductor chips which are configured to emit light of mutually different colors, wherein
the semiconductor chips are mounted close to each other on the connection surfaces such that a distance between adjacent semiconductor chips is at most 100 μm in a top view on the carrier upper side,
exactly one of the semiconductor chips is configured to generate blue light,
exactly one of the semiconductor chips is configured to generate cyan-colored light,
exactly one of the semiconductor chips is configured to generate green light,
exactly one of the semiconductor chips is configured to generate yellow-orange light,
exactly two of the semiconductor chips are configured to generate red light, and
the semiconductor chips are arranged in two rows and, as seen in top view on the carrier upper side, as point-symmetrically as possible with respect to their emission properties.

7. The optoelectronic semiconductor device according to claim 6,
wherein the semiconductor chips for various colors in a CIE standard chromaticity diagram each show, with a tolerance of 0.003 units, the following CIE x coordinates; CIE y coordinates:
for blue light 0.159; 0.024,
for cyan-colored light 0.079; 0.453,
for green light 0.286; 0.574,
for yellow-orange light 0.543; 0.429, and
for red light 0.680; 0.316.

8. The optoelectronic semiconductor device according to claim 6,
wherein the semiconductor chips for blue and cyan-colored light emit directly from a semiconductor layer sequence, and
wherein the semiconductor chips for green, yellow-orange and red light each comprise at least one phosphor for generating the corresponding light.

9. The optoelectronic semiconductor device according to claim 6,
wherein
the exactly one of the semiconductor chips configured to generate blue light is configured to emit directly from a semiconductor layer sequence,
the exactly one of the semiconductor chips configured to generate cyan-colored light comprises (Sr,Ba)Si2O2N2:Eu as phosphor,
the exactly one of the semiconductor chips configured to generate green light comprises NOS:Eu, LuYAG:Ce and/or YAG:Ce as phosphor,
the exactly one of the semiconductor chips configured to generate yellow-orange light comprises (Sr,Ca)AlSiN:Eu mixed with YAG:Ce as phosphor,
the exactly one of the semiconductor chips configured to generate red light comprises (Sr,Ca)AlSiN:Eu as phosphor, and
the phosphors of the semiconductor chips for cyan-colored, green, yellow-orange and red light are each configured for full conversion of a primary radiation.

10. The optoelectronic semiconductor device according to claim 6,
wherein for wavelengths of intensity maxima and for half widths of the respective emission spectra of the semiconductor chips applies:
intensity maximum for blue light between 445 nm and 455 nm inclusive and half width between 10 nm and 30 nm inclusive,
intensity maximum for cyan-colored light between 500 nm and 512 nm inclusive and half width between 15 nm and 40 nm inclusive,
intensity maximum for green light between 520 nm and 535 nm inclusive and half width between 35 nm and 90 nm inclusive,
intensity maximum for yellow-orange light between 595 nm and 615 nm inclusive and half width between 50 nm and 100 nm inclusive, and
intensity maximum for red light between 625 nm and 650 nm inclusive and half width between 50 nm and 100 nm inclusive.

11. The optoelectronic semiconductor device according to claim 6,
wherein the semiconductor chips or groups of semiconductor chips are electrically drivable individually for a specific color.

12. The optoelectronic semiconductor device according to claim 6,
wherein the semiconductor chips each exhibit a Lambertian or an approximately Lambertian radiation characteristic.

13. The optoelectronic semiconductor device according to claim 6,
wherein the semiconductor chips on the carrier have a common anode terminal or a common cathode terminal.

14. The optoelectronic semiconductor device according to claim 6,
wherein the semiconductor chips on the carrier each have their own anode terminal and their own cathode terminal.

15. The optoelectronic semiconductor device according to claim 6,
wherein the semiconductor chips are separated from each other by a gas-filled or evacuated gap such that there is no external optical shielding between adjacent semiconductor chips.

16. The optoelectronic semiconductor device according to claim 6,
wherein each of the semiconductor chips is chipwise associated with its own protection diode against damage by electrostatic discharges.

17. The optoelectronic semiconductor device according to claim 6,
wherein semiconductor layer sequences of the semiconductor chips each comprise a plurality of vias through an active zone.

* * * * *